(12) United States Patent
Tews et al.

(10) Patent No.: US 6,486,024 B1
(45) Date of Patent: Nov. 26, 2002

(54) INTEGRATED CIRCUIT TRENCH DEVICE WITH A DIELECTRIC COLLAR STACK, AND METHOD OF FORMING THEREOF

(75) Inventors: Helmut Horst Tews, Poughkeepsie, NY (US); Alexander Michaelis, Dormagen (DE); Stephan Kudelka; Uwe Schroeder, both of Fishkill, NY (US); Ulrike Gruening, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/577,102

(22) Filed: May 24, 2000

(51) Int. Cl.⁷ .......................................... H01L 21/8242
(52) U.S. Cl. .................. 438/249; 438/248; 438/246; 438/244; 438/387; 438/389; 438/391; 438/392
(58) Field of Search ................................ 438/243–249, 438/386–392

(56) References Cited

U.S. PATENT DOCUMENTS 6,069,049 A * 5/2000 Geiss et al. ................. 438/386
6,200,873 B1 * 3/2001 Schrems et al. ............. 438/386
6,245,612 B1 * 6/2001 Chang et al. ................ 438/249

FOREIGN PATENT DOCUMENTS

| DE | 19842665 A1 | * | 4/2000 |
| EP | 0 735 581 | | 3/1996 |
| EP | 0 852 396 | | 12/1997 |
| EP | 0 987 754 | | 3/2000 |

* cited by examiner

Primary Examiner—John F. Niebling
Assistant Examiner—Jennifer M. Kennedy
(74) Attorney, Agent, or Firm—Slater & Matsil, L.L.P.

(57) ABSTRACT

A method of using at least two insulative layers to form the isolation collar of a trench device, and the device formed therefrom. The first layer is preferably an oxide (e.g., silicon dioxide 116) formed on the trench substrate sidewalls, and is formed through a TEOS, LOCOS, or combined TEOS/LOCOS process. Preferably, both the TEOS process and the LOCOS process are used to form the first layer. The second layer is preferably a silicon nitride layer (114) formed on the oxide layer. The multiple layers function as an isolation collar stack for the trench. The dopant penetration barrier properties of the second layer permit the dielectric collar stack to be used as a self aligned mask for subsequent buried plate (120) doping.

20 Claims, 5 Drawing Sheets

INTEGRATED CIRCUIT TRENCH DEVICE WITH A DIELECTRIC COLLAR STACK, AND METHOD OF FORMING THEREOF

TECHNICAL FIELD

The present invention relates generally to an integrated circuit ("IC") and method of forming thereof, and more particularly to an integrated circuit vertical trench device and method of forming thereof.

BACKGROUND

The semiconductor industry is continuously trying to decrease the size of the semiconductor devices located on integrated circuits. Miniaturization is generally needed to accommodate the increasing density of circuits necessary for today's semiconductor products. For example, it is not uncommon for there to be millions of semiconductor devices on a single semiconductor product.

Typically, the focus of miniaturization has been placed on the two-dimensional horizontal plane of a semiconductor device, and devices have approached sizes down to tenths of microns and less. There is some limit, however, as to how far a horizontally oriented semiconductor device can be shrunk, and as devices are made even smaller, it is generally becoming increasingly difficult to further miniaturize a device's horizontal dimensions. In addition, the decreasing horizontal dimensions of semiconductor devices generally tend to create problems in the operational characteristics of the semiconductor devices.

One such semiconductor product widely used in electronic systems for storing data is a semiconductor memory, and one common type of semiconductor memory is a dynamic random access memory ("DRAM"). A DRAM may include millions or billions of individual DRAM cells, each cell storing one bit of data. A DRAM memory cell typically includes an access field-effect transistor ("FET") and a storage capacitor. The access FET allows the transfer of data charges to and from the storage capacitor during reading and writing operations. In addition, the data charges on the storage capacitor are periodically refreshed during a refresh operation.

Semiconductor memory density is typically limited by a minimum lithographic feature size that is imposed by lithographic processes used during fabrication. There is a continuing need in the art to provide even higher density memories in order to further increase data storage capacity and reduce manufacturing costs.

One way of increasing the data storage capacity of semiconductor memories is to reduce the amount of integrated circuit horizontal planar area consumed by each memory cell. For horizontally oriented devices, this may be done by decreasing the size of the access FET or the storage capacitor, or both. This approach has limits, however, due to minimum producible structure size in a given fabrication technology, and the problems associated with devices with small dimensions, such as hot carriers, punch through, and excess leakage.

Another way of providing planar area reduction is the use of a three-dimensional arrangement of the access FET and the storage capacitor. One such arrangement is a planar FET next to a deep trench capacitor. A trench typically has a depth of 5–8 um and an oval top-down-view shape. The trench capacitor has plates which are located vertically along the walls of the trench instead of being parallel to the surface of the integrated circuit substrate. This permits a large capacitance per planar unit area of substrate, while at the same time allowing the device to be of a manageable size for purposes of operation. Alternatively, a vertical transistor with a vertically oriented gate may be fabricated in the trench.

In the prior art, a collar oxide is typically formed on an upper portion of the trench sidewalls, for example, down to about 1.5 microns into the trench. The collar oxide generally provides isolation for the trench devices and prevents the formation of parasitic elements, such as a vertical parasitic transistor in the upper region of the trench. The collar oxide is typically a layer of silicon dioxide with a thickness of about 200–500 angstroms.

There are generally several problems, however, with prior art approaches to fabricating the collar oxide in a vertical DRAM cell. For example, a collar oxide may be formed using a Local Oxidation of Silicon ("LOCOS") process. With the LOCOS process, a masking step is used to define the length (that is, depth into the trench) of the LOCOS collar. The mask, which may be silicon nitride, is a trench fill layer that has been etched back, or recessed, to the appropriate depth in the trench. A thermal oxide is then grown on the trench sidewalls above the mask. One problem with this approach is that silicon from the trench sidewalls is consumed during the oxidation process, in general requiring a tighter or smaller mask opening for the prior trench etch. Growing an oxide of sufficient thickness may cause mechanical stress as the oxide expands and consumes substrate material. High temperatures are also generally required to grow the oxide.

Another problem with the LOCOS process is that the oxidation rate is generally strongly crystal plane dependent. Because the substrate sidewalls of the trench comprise different crystal planes, the oxide thickness can vary substantially around the trench, causing leakage and other device reliability problems.

After the trench mask is removed, the buried plate of the trench capacitor is typically formed by doping the substrate surrounding the lower portion of the trench. A deposition-free doping technique such as gasphase doping, however, is difficult to use because the dopant (e.g., arsenic) tends to penetrate the LOCOS collar oxide. An alternative is to use a deposited doping layer, such as arsenic silicate glass ("ASG"). This approach, however, generally requires another recess step after the buried plate doping step in order to remove the deposited layer from the collar oxide.

As another example, the collar oxide may be formed using a deposition method, such as tetraethyloxysilane decomposition process ("TEOS process"). In this case, no silicon from the trench sidewalls is consumed because the oxide is deposited instead of being grown. A difficulty with this approach is that the buried plate dopant process, whether deposited or deposition-free, has the same dopant penetration problem as the LOCOS process. That is, the buried plate dopant process is not a self-aligned process.

SUMMARY OF THE INVENTION

These problems are generally solved or circumvented, and technical advantages are generally achieved, by a preferred embodiment of the invention in which at least two insulative layers are used for the isolation collar of a trench device. The first layer is preferably an oxide formed on the trench substrate sidewalls, and is formed through a TEOS, LOCOS, or combined TEOS/LOCOS process. Preferably, both the TEOS process and the LOCOS process are used to form the first layer. The second layer is preferably a silicon nitride layer formed on the oxide layer. The multiple layers function as the isolation collar for the trench, and generally avoid the problems associated with prior art methods of using a single oxidation process alone.

In accordance with a preferred embodiment of the present invention, a method of forming an isolation collar in a deep trench on a semiconductor substrate comprises forming a conformal oxide layer on an interior surface of the trench; filling a lower portion of the trench with a mask layer, thereby masking a lower sidewall and bottom of the oxide layer and leaving an upper sidewall of the oxide layer unmasked; forming a conformal insulation layer on the oxide layer upper sidewall and on an upper surface of the mask layer; anisotropically etching the insulation layer to remove horizontal sections of the insulation layer, thereby leaving an upper sidewall of the insulation layer in the trench adjacent the oxide layer upper sidewall; removing the mask layer from the trench to expose the lower sidewall and bottom of the oxide layer; and removing the lower sidewall and bottom of the oxide layer from the trench to expose the substrate surface in the lower portion of the trench.

In accordance with another preferred embodiment of the present invention, a method of forming a dynamic random access memory (DRAM) integrated circuit comprises forming a deep trench in a semiconductor substrate; forming a multiple layer isolation collar in the trench; forming a trench capacitor in a lower portion of the trench; and forming a vertical trench transistor in an upper portion of the trench. Forming the isolation collar comprises forming an oxide layer on an upper sidewall of the trench; and forming an insulation layer on the oxide layer.

In accordance with yet another preferred embodiment of the present invention, a dynamic random access memory (DRAM) integrated circuit (IC) comprises a deep trench located in a semiconductor substrate, the trench having an upper portion and a lower portion; a trench capacitor in the lower portion of the trench; and a multiple layer isolation collar in the upper portion of the trench. The isolation collar comprises an oxide layer on an upper sidewall of the trench; and an insulation layer on the oxide layer.

An advantage of a preferred embodiment of the present invention is that a reliable DRAM memory cell may be formed with a trench capacitor (with either a planar or vertical transistor), thus using devices of manageable size yet occupying minimal horizontal planar area.

Another advantage of a preferred embodiment of the present invention is that the isolation collar stack combines the advantages of the TEOS process and LOCOS process, while avoiding the problems associated with each process when used alone. For example, if a LOCOS process is used, it is only used to provide a portion of the isolation collar. Therefore the thickness of the oxide formed from the LOCOS process itself is less than the thickness of the LOCOS oxide of the prior art, and the effect of crystal plane dependent growth is minimized.

Another advantage of a preferred embodiment of the present invention is that it enables a self aligned process to be used for buried plate doping. Penetration of the dopant into the isolation collar is minimized, and an extra recess step is not needed.

Another advantage of a preferred embodiment of the present invention is that little or no silicon from the trench sidewalls is consumed in forming the isolation collar, thus imparting little mechanical stress on the structure. In addition, the tighter trench mask associated with a prior art LOCOS process is not required.

Another advantage of a preferred embodiment of the present invention is that a nitride mask for high temperature LOCOS oxidation is not needed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention. The figures are drawn so as to clearly illustrate the relevant aspects of the preferred embodiments, and are not necessarily drawn to scale.

The invention relates to integrated circuits, including memory ICs such as random access memories ("RAM"s), DRAMs, synchronous DRAMS("SDRAM"s), merged DRAM-logic circuits ("embedded DRAM"s), or other circuits. The invention also relates to semiconductor processes and structures, including vertical capacitors, vertical transistors, trench capacitors and trench transistors, the connections between such semiconductor devices, or other processes and structures.

Figure 1:
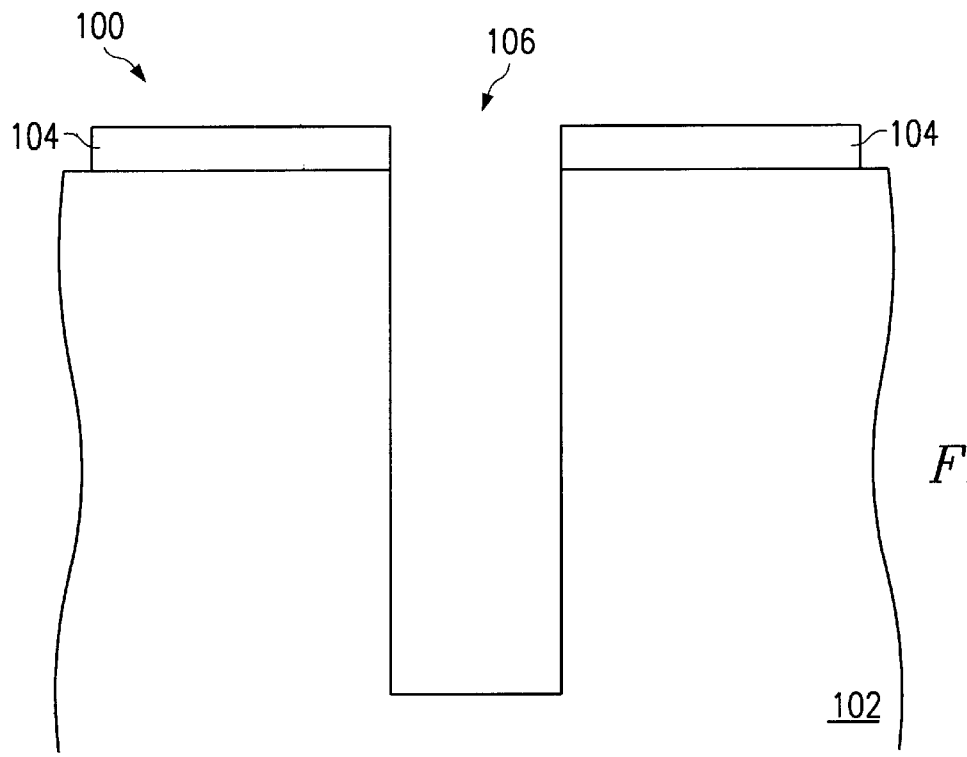
FIGS. 1–10 are cross-sectional views of an integrated circuit structure in accordance with a preferred embodiment of the present invention at various stages of fabrication.

Referring now to FIG. 1, there is illustrated semiconductor substrate 102 in which some initial processing on semiconductor device 100 has already been performed. Substrate 102 preferably comprises silicon, although it may comprise other semiconductor materials, such as gallium arsenide. Substrate 102 is consistently assumed to be a p-substrate for ease of discussion, although an n-substrate may also be employed to form trench capacitors, as is well known to those skilled in the art. Pad nitride 104 is formed on the surface of substrate 102 to protect the substrate surface during subsequent processing. Pad nitride layer 104 may represent a layer of $N_xO_y$ and may be, for example, 150 to 250 nm thick, although other suitable protective materials and thicknesses may be used. A hard mask layer such as silicon dioxide is formed on pad nitride layer 104, and is then patterned using photolithographic techniques to form the mask for the deep trench etch. Trench 106 is formed in substrate 102 using a suitable etching process, preferably dry etching, and more preferably reactive ion etching ("RIE"). The hard mask layer then may be removed. Preferably, deep trench 106 is between 5 and 10 microns deep, and may be as small as 150 nm across or smaller, although other dimensions may be used depending on the particular application.

Figure 2:
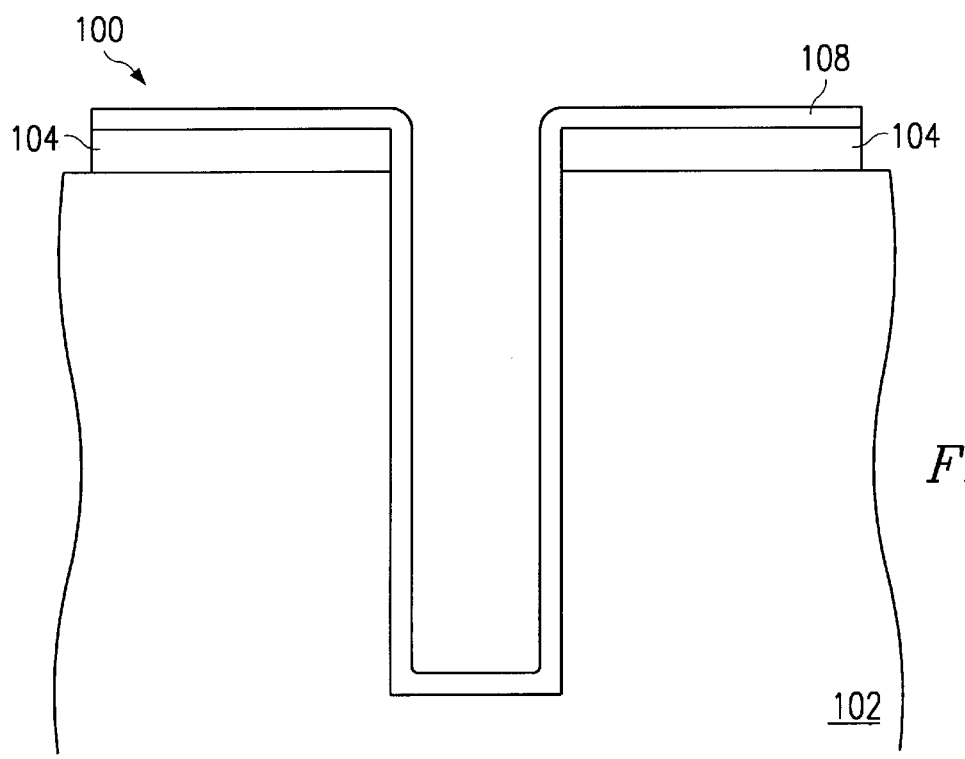

Referring to FIG. 2, oxide layer 108 is conformally formed on the trench sidewalls and on the trench bottom. In the preferred embodiment, oxide layer 108 is a 50 to 200 angstroms thick silicon dioxide layer formed with a TEOS process. Preferably, the TEOS process is followed by a LOCOS process which has the effect of densifying the TEOS deposited oxide. Alternatively, these processes may be switched, with the LOCOS oxide being formed first, followed by a TEOS oxide deposition, and then a densification anneal. As yet another alternative, a single layer of TEOS oxide without the LOCOS process may be used. Because a LOCOS oxidation is not used to form the entire isolation collar, the detrimental effects of, for example, mechanical stress and crystal plane dependent growth are minimized. The absolute and relative thicknesses of the various oxide layers may be varied to suit the particular application.

Figure 3:
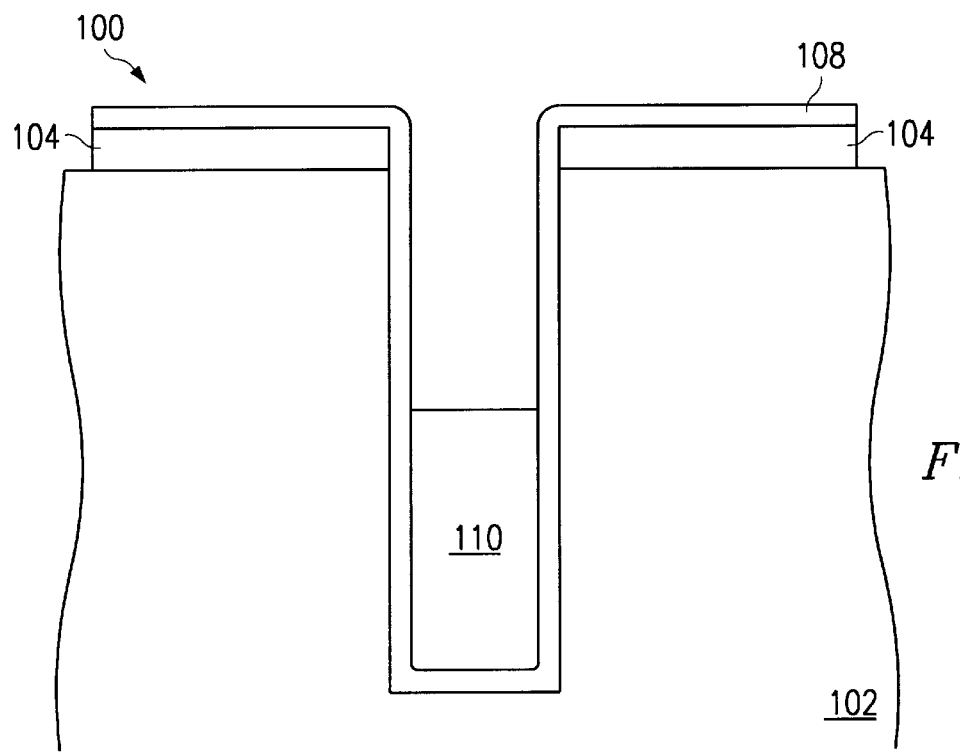

Referring to FIG. 3, mask layer 110 is deposited on the structure, filling trench 106. Mask layer 110 is preferably polysilicon, although any other material with sufficient process selectivity with respect to the materials making up the isolation collar may be used. Chemical mechanical polishing is performed on mask layer 110, and a recess process is used to recess the layer down into the trench to level showed in FIG. 3.

Figure 4:
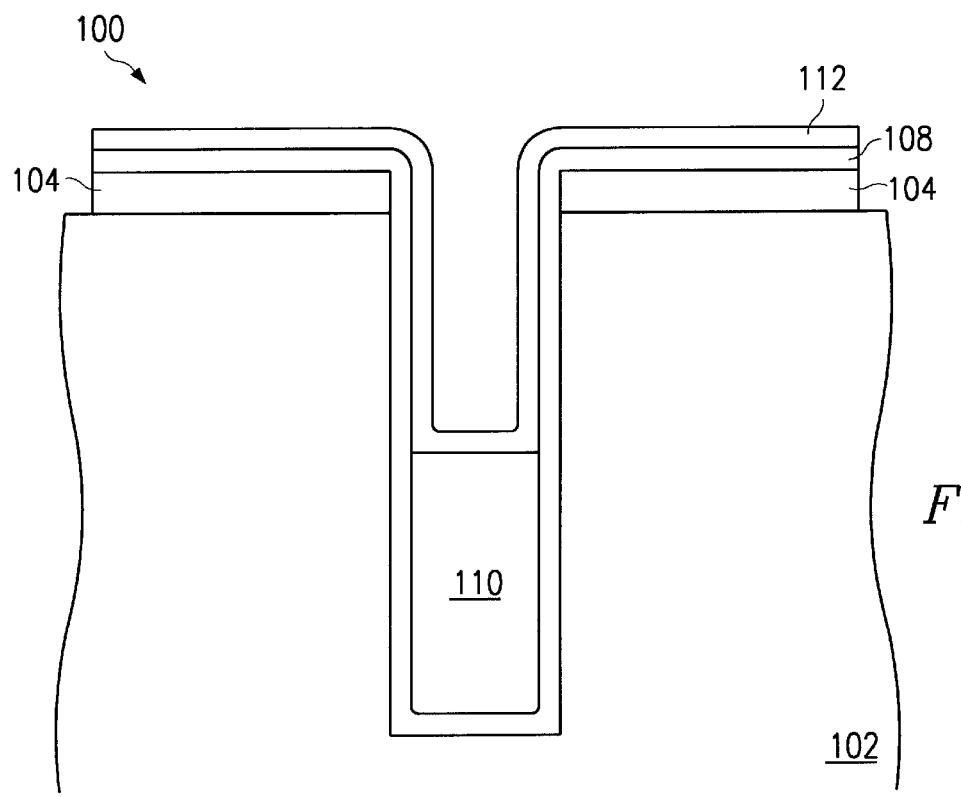
Figure 5:
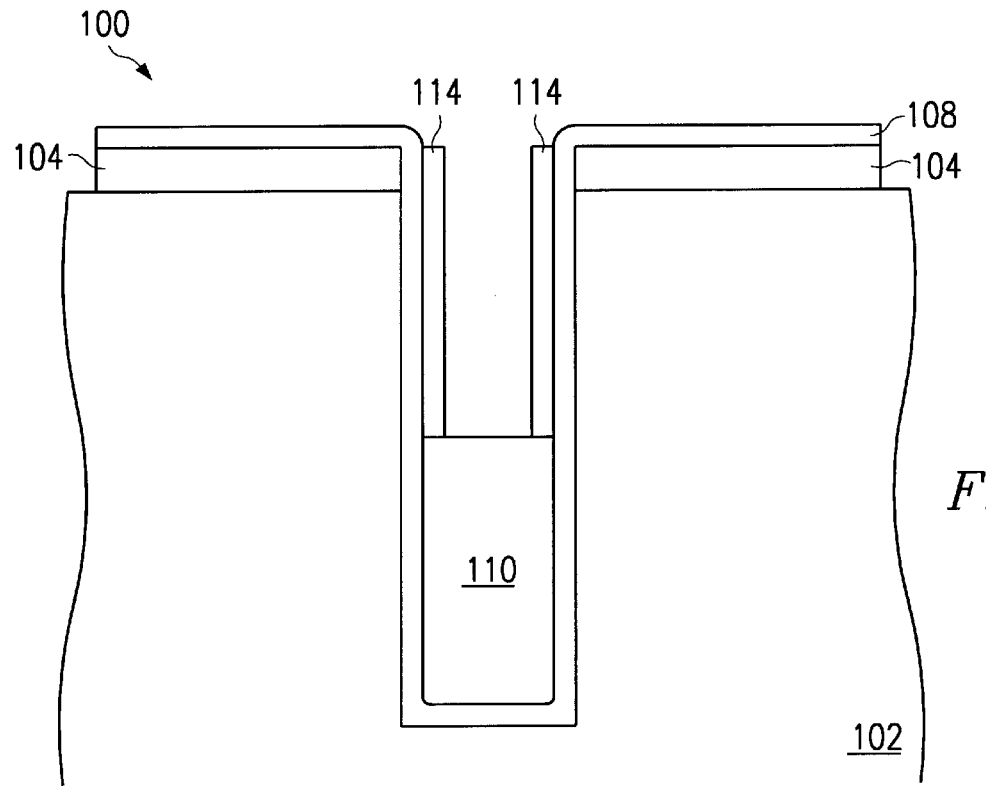

Referring to FIG. 4, a conformal insulation layer 112 is deposited on the structure. Insulation layer 112 is preferably a 20 to 100 angstrom thick layer of silicon nitride formed with a chemical vapor deposition process. Alternatively, other thicknesses or materials may be used. In a preferred embodiment, the material should possess a low dopant diffusion coefficient so that it provides a barrier to dopant diffusion during buried plate formation. An anisotropic etch process, such as reactive ion etching, removes the silicon nitride 112 from the horizontal surfaces of the structure. This exposes mask layer 110 and the horizontal regions of oxide layer 108 formed on pad nitride 104. As illustrated in FIG. 5, the remaining silicon nitride forms the insulation layer sidewall 114 around the upper portion of the trench, and delineates the section of the trench which will comprise the isolation collar.

In another alternative embodiment, another oxide layer (or other material) may be formed on the dopant barrier layer as part of the dielectric collar stack. This embodiment provides the capability of using a material with different process (e.g., etch) selectivity than the dopant barrier layer during subsequent process steps.

Figure 6:
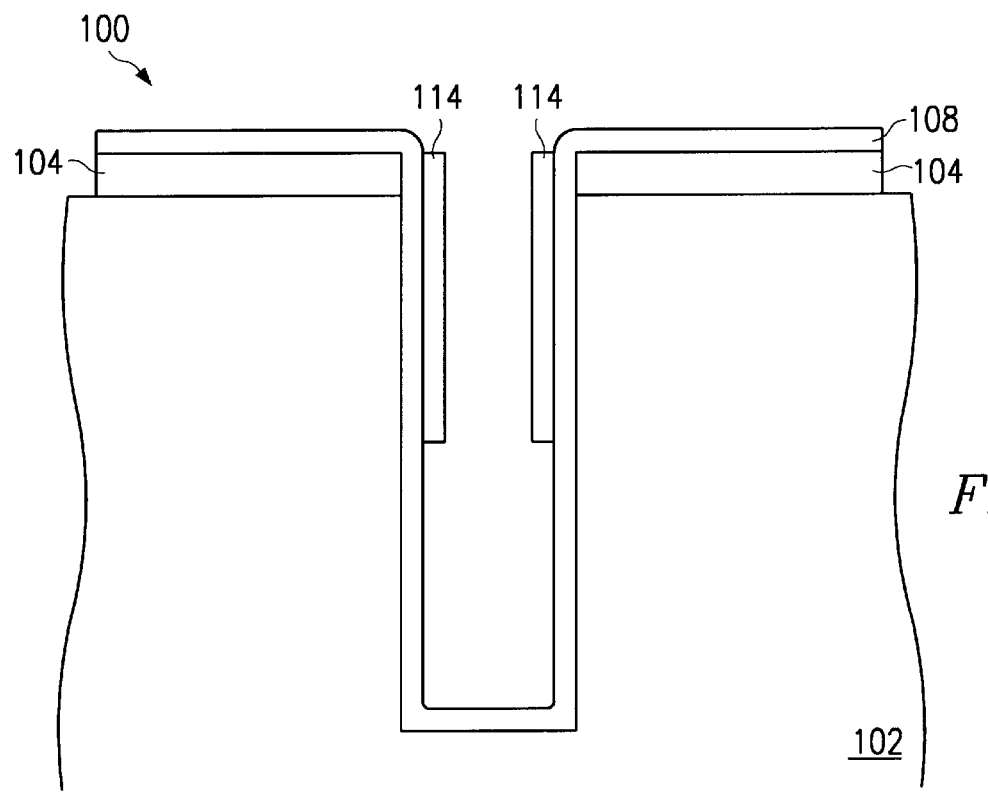
Figure 7:
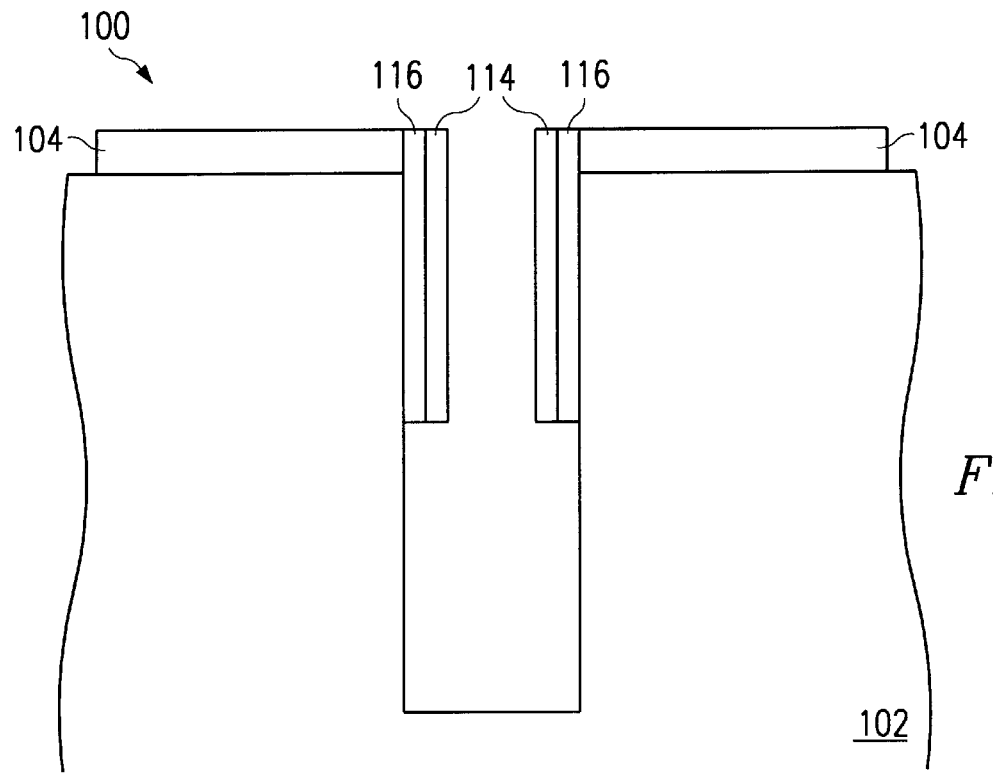

Mask layer 110 is then removed from the trench with a wet chemical etch. Alternatively, a combined dry/wet etch or a dry etch may be used. The etch exposes the sections of oxide layer 108 on the trench bottom and on the sidewalls in the lower portion of the trench, resulting in the structure illustrated in FIG. 6. An oxide etch may then be used to remove the exposed sections of oxide layer 108 in the trench. The section of the oxide layer in the upper portion of the trench is protected by silicon nitride layer 114, and is not removed from the substrate by the oxide etch. The resulting structure is illustrated in FIG. 7, in which the combined silicon dioxide layer 116 and silicon nitride layer 114 form the isolation collar for the trench.

Figure 8:
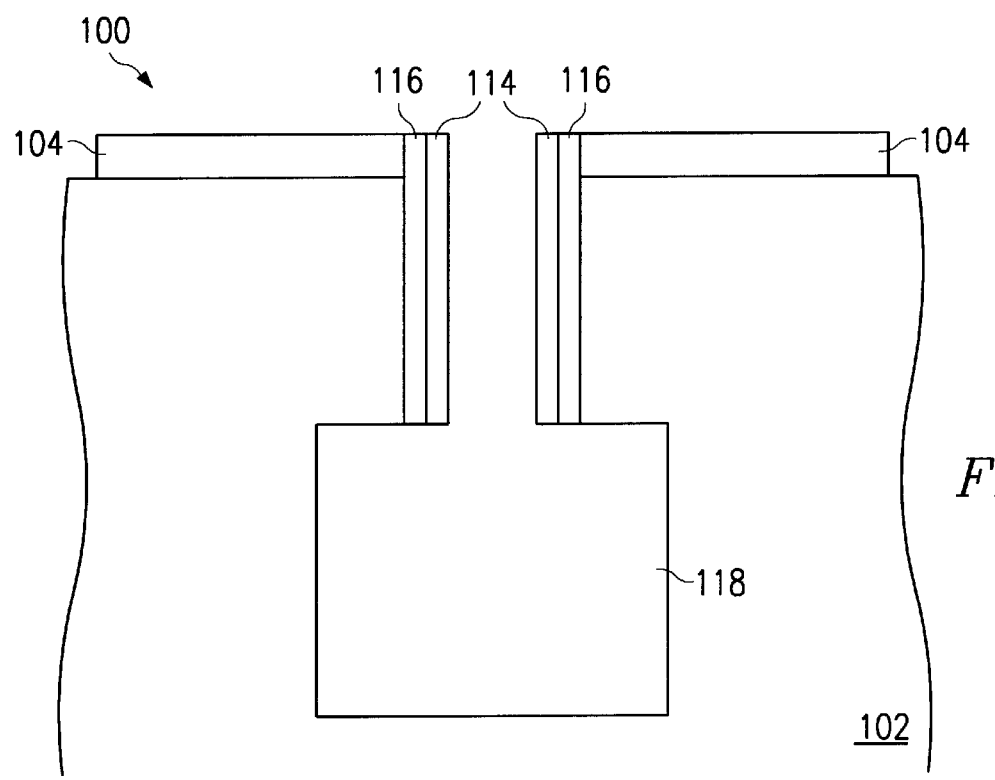
Figure 9:
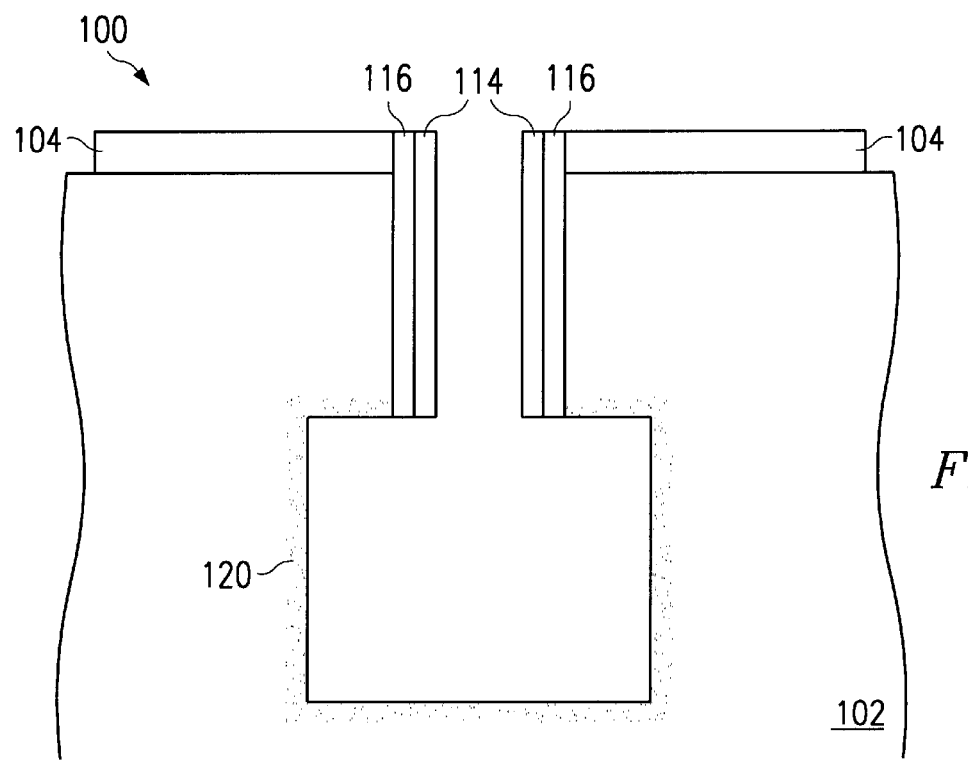

Referring to FIG. 8, a bottle etch may be performed to increase the size of the lower portion of the trench 118 below the isolation collar. The increased surface area provides a larger surface of which to form the capacitor dielectric, thus increasing the capacitance of the device. Referring to FIG. 9, a buried plate 120, which will function as the first plate of the trench capacitor, is formed in the exposed substrate trench walls in the lower portion of the trench. Methods of deposition include, for example, chemical vapor deposition, plasma vapor deposition, sputtering or any other suitable deposition technique. Buried plate doping is preferably performed by implanting arsenic using gasphase doping or ASG. The silicon nitride layer 114 protects silicon dioxide layer 116 from dopant penetration during buried plate formation, thus enabling a self-aligned process for buried plate doping, as well as for trench bottom formation.

Figure 10:
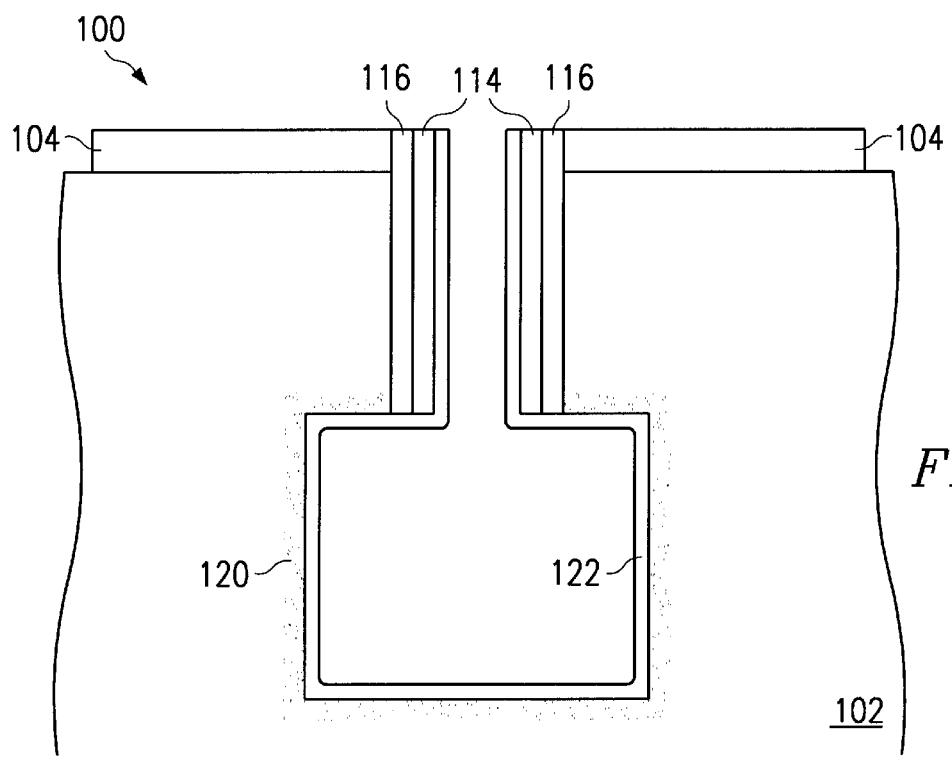

Referring to FIG. 10, node dielectric 122 is then formed on the trench sidewalls and on silicon nitride layer 114. Node dielectric 122 will function as the capacitor dielectric, and is preferably silicon nitride, but may be formed of other high dielectric constant materials, such as $ZrO_2$, $HfO_2$, and $Al_2O_3$. The inner plate of the capacitor may then be formed in the lower portion of the trench using, for example, polysilicon. It should be noted that several process steps, known to those of ordinary skill in the art, but unnecessary to an understanding of the present invention, are not described in detail herein. For example, the remainder of a DRAM cell, including the transistor, and connections to word and bit lines, may be completed using conventional DRAM processing techniques. The resulting DRAM may then be employed in a variety of commercial and consumer electronics devices, including computers.

There are many alternative materials and processes which could be substituted for those disclosed in the above embodiments by one of ordinary skill in the art, and all such alternatives are considered to be within the scope of the present invention. For example, p-type materials or doping may be substituted for n-type materials and doping, and vice versa. In addition, the order of process steps may be rearranged by one of ordinary skill in the art, yet still be within the scope of the present invention. As used herein, devices, layers, materials, etc. may be described, for example, as being "in" a trench, or formed "on" a trench sidewall surface, and all such descriptions are generally intended to include such devices, layers, and materials extending into regions proximate the trench or sidewall surface.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an isolation collar in a deep trench on a semiconductor substrate, said method comprising:

forming a conformal oxide layer on an interior surface of said trench;

filling a lower portion of said trench with a mask layer, thereby masking a lower sidewall and bottom of said oxide layer and leaving an upper sidewall of said oxide layer unmasked;

forming a conformal insulation layer on said oxide layer upper sidewall and on an upper surface of said mask layer;

anisotropically etching said insulation layer to remove horizontal sections of said insulation layer, thereby leaving an upper sidewall of said insulation layer in said trench adjacent said oxide layer upper sidewall;

removing said mask layer from said trench to expose said lower sidewall and bottom of said oxide layer; and removing said lower sidewall and bottom of said oxide layer from said trench to expose said substrate surface in said lower portion of said trench.

2. The method of claim 1, wherein said forming said conformal oxide comprises a tetraethyloxysilane decomposition (TEOS) process.

3. The method of claim 2, wherein said forming said conformal oxide further comprises a local oxidation of silicon (LOCOS) process.

4. The method of claim 3, wherein said TEOS process is performed before said LOCOS process.

5. The method of claim 2, wherein said forming said conformal oxide further comprises a densification anneal after said TEOS process.

6. The method of claim 1, wherein said substrate is silicon, said conformal oxide is silicon dioxide, and said conformal insulation layer is silicon nitride.

7. The method of claim 6, wherein said silicon dioxide is between about 50 angstroms and about 200 angstroms thick, and said silicon nitride is between about 20 angstroms and about 100 angstroms thick.

8. The method of claim 6, wherein said silicon nitride is deposited using chemical vapor deposition.

9. The method of claim 1, wherein said anisotropically etching comprises a reactive ion etch.

10. The method of claim 1, wherein said filling said lower portion of said trench with a mask layer further comprises:

depositing a polysilicon layer on said substrate filling said trench;

chemical mechanical polishing said polysilicon layer; and recess etching said polysilicon layer down to said lower portion of said trench.

11. The method of claim 1, further comprising forming said deep trench before said forming said conformal oxide layer.

12. The method of claim 11, wherein said forming said deep trench comprises:

forming a hard mask layer on said semiconductor substrate;

patterning said hard mask layer;

reactive ion etching said semiconductor substrate to form said deep trench; and removing said hard mask.

13. The method of claim 12, wherein said hard mask layer is silicon dioxide.

14. The method of claim 1, further comprising forming a pad nitride on said semiconductor substrate before said forming said conformal oxide layer.

15. The method of claim 1, further comprising forming a second conformal oxide layer on said conformal insulation layer after said forming said conformal insulation layer.

16. The method of claim 15, further comprising anisotropically etching said second conformal oxide layer to remove horizontal sections of said second conformal oxide layer.

17. The method of claim 1, wherein said removing said mask layer comprises a wet chemical etch.

18. The method of claim 3, wherein said LOCOS process is performed before said TEOS process.

19. A method of forming an isolation collar in a deep trench on a silicon substrate, said method comprising:

forming a conformal silicon dioxide layer on an interior surface of said trench using a tetraethyloxysilane decomposition (TEOS) process;

filling a lower portion of said trench with a mask layer, thereby masking a lower sidewall and bottom of said silicon dioxide layer and leaving an upper sidewall of said silicon dioxide layer unmasked;

forming a conformal silicon nitride layer on said silicon dioxide layer upper sidewall and on an upper surface of said mask layer;

anisotropically etching said silicon nitride layer to remove horizontal sections of said silicon nitride layer, thereby leaving an upper sidewall of said silicon nitride layer in said trench adjacent said silicon dioxide layer upper sidewall;

removing said mask layer from said trench to expose said lower sidewall and bottom of said silicon dioxide layer; and removing said lower sidewall and bottom of said silicon dioxide layer from said trench to expose said silicon substrate surface in said lower portion of said trench.

20. A method of forming an isolation collar in a deep trench on a silicon substrate, said method comprising:

forming a pad nitride layer on said silicon substrate;

forming said deep trench;

forming a conformal silicon dioxide layer on an interior surface of said trench;

filling a lower portion of said trench with a mask layer, thereby masking a lower sidewall and bottom of said silicon dioxide layer and leaving an upper sidewall of said silicon dioxide layer unmasked;

forming a conformal silicon nitride layer on said silicon dioxide layer upper sidewall and on an upper surface of said mask layer;

anisotropically etching said silicon nitride layer to remove horizontal sections of said silicon nitride layer, thereby leaving an upper sidewall of said silicon nitride layer in said trench adjacent said silicon dioxide layer upper sidewall;

removing said mask layer from said trench to expose said lower sidewall and bottom of said silicon dioxide layer; and removing said lower sidewall and bottom of said silicon dioxide layer from said trench to expose said silicon substrate surface in said lower portion of said trench.

* * * * *